United States Patent
Qi et al.

(10) Patent No.: US 6,650,022 B1
(45) Date of Patent: Nov. 18, 2003

(54) SEMICONDUCTOR DEVICE EXHIBITING ENHANCED PATTERN RECOGNITION WHEN ILLUMINATED IN A MACHINE VISION SYSTEM

(75) Inventors: Jing Qi, Lake Zurich, IL (US); Janice Danvir, Arlington Heights, IL (US); Zhaojin Han, Lake Zurich, IL (US); Prasanna Kulkarni, Schaumburg, IL (US); Nadia Yala, Schaumburg, IL (US); Robert Doot, Seattle, WA (US)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 10/241,017

(22) Filed: Sep. 11, 2002

(51) Int. Cl.$^7$ .......................... H01L 33/00; H01L 29/76
(52) U.S. Cl. ..................... 257/797; 257/782; 257/786
(58) Field of Search ............................... 257/797, 782, 257/786

(56) References Cited

U.S. PATENT DOCUMENTS

| | | | |
|---|---|---|---|
| 5,651,493 A | * | 7/1997 | Bielick |
| 6,194,788 B1 | | 2/2001 | Gilleo et al. .................. 257/789 |
| 6,217,987 B1 | * | 4/2001 | Ono et al. |
| 6,272,018 B1 | * | 8/2001 | Feld et al. |
| 6,479,760 B2 | * | 11/2002 | Kimbara et al. |

* cited by examiner

*Primary Examiner*—Stephen D. Meier
(74) *Attorney, Agent, or Firm*—Daniel K. Nichols

(57) ABSTRACT

A bumped semiconductor device (10) exhibiting enhanced pattern recognition when illuminated in a machine vision system. The semiconductor device has a substantially coplanar array of solder bumps (16) and a coating of underfill material (17) on one face. A fluxing composition (18) containing an image enhancing agent is selectively deposited over at least two of the solder bumps in the array to modify the optical characteristics of the solder bumps to cause the solder bumps to appear bright against the background of the underfill material when the semiconductor device is illuminated (19) by selected wavelengths of light.

23 Claims, 1 Drawing Sheet

SEMICONDUCTOR DEVICE EXHIBITING ENHANCED PATTERN RECOGNITION WHEN ILLUMINATED IN A MACHINE VISION SYSTEM

This invention was made with United States Government support under Agreement No. 70NANB8H4007 awarded by the National Institute of Standards and Technology (NIST). The United States Government has certain rights in the invention.

FIELD OF THE INVENTION

The invention pertains to semiconductor devices, and, more particularly, to semiconductor devices modified to enhance the capabilities of machine vision systems for automated assembly.

BACKGROUND OF THE INVENTION

At the heart of an integrated circuit is a semiconductor die. To facilitate handling, the die is sometimes fastened to a supporting carrier. In addition to providing stability, the carrier has larger terminations that can be more easily soldered to other circuit components, e.g., on a printed circuit board (PCB). Another packaging approach which is commonly referred to as "flip chip" packaging generally contemplates forming solder bumps (or other suitable contacts) directly on the integrated circuit die, and soldering the flip chip directly to the printed circuit board. When a flip chip or semiconductor package is attached to the substrate, an air gap remains between flip chip and substrate. This gap is commonly filled with a material that is typically a mixture of a resin and small silica spheres and is generally referred to as underfill. The underfill material aids in bonding the chip or package to the PCB.

Machine vision systems play an important role in automated assembly systems. Cameras are used to obtain images of articles, and image processing is performed to identify features of the article. Further image processing may be performed to identify the article's position, measure its dimensions, and/or to check for article defects. Image processing results may then be used to aid in the control of automated systems, such as factory equipment, including, for example, an industrial controller, a robotic arm, or a positioning table. Present methods of high speed electronic assembly require that the underfill be applied to the flip chip or the semiconductor package prior to attachment to the PCB. The coating thickness of the underfill is one of the most important factors that affects assembly yield and reliability. Underfill coating thickness should be comparable to the solder bump height in order to have sufficient underfill fillet formation after solder reflow to the PCB. However, coating to the solder bump height pushes the limits of the vision system on the placement machines. The performance of the machine vision system is highly dependent on the exposed area of the solder bump and, more accurately, the contrast between the bump and the underfill. With underfill coated chips the bump exposed area is reduced and the bump is difficult to optically measure, which makes the inspection of coated parts prior to placement difficult. Sometimes the vision system can't recognize the solder bump at all if the coating covers the bump or if the bump open area is beyond the camera resolution. Hence rejection of electrically functional parts will occur. As lead pitch and feature size continue to be reduced, this problem becomes further aggravated.

BRIEF DESCRIPTION OF THE DRAWINGS

The features of the invention believed to be novel are set forth with particularity in the appended claims. The invention itself however, both as to organization and method of operation, together with objects and advantages thereof, may be best understood by reference to the detailed description of the invention, which describes certain exemplary embodiments of the invention, taken in conjunction with the accompanying drawings in which:

DETAILED DESCRIPTION OF THE INVENTION

Figure 1:
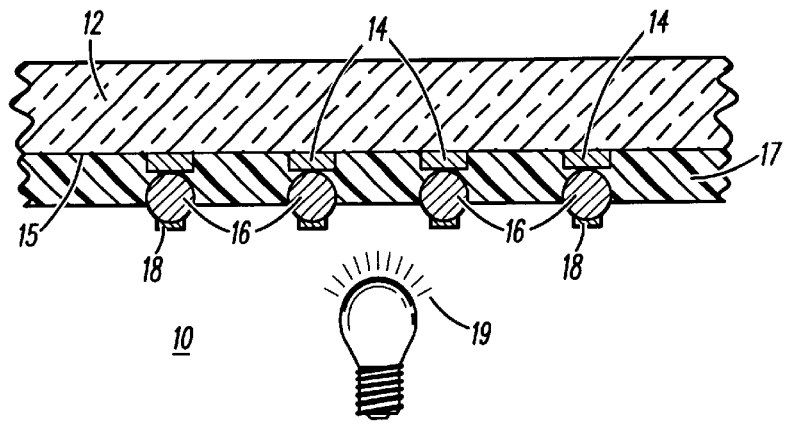
FIG. 1 is a cross-sectional view of a first embodiment of the present invention.

While this invention is susceptible of embodiment in many different forms, there is shown in the drawings and will herein be described in detail specific embodiments, with the understanding that the present disclosure is to be considered as an example of the principles of the invention and not intended to limit the invention to the specific embodiments shown and described. In the description below, like reference numerals are used to describe the same, similar or corresponding elements in the several views of the drawings, and the scale of certain features of the drawings is exaggerated to aid the reader. A bumped semiconductor device exhibiting enhanced pattern recognition when illuminated in a machine vision system is disclosed. The semiconductor device has a substantially coplanar array of solder bumps. A fluxing composition containing an image enhancing agent is selectively deposited over at least two of the solder bumps in the array to modify the optical characteristics of the solder bumps to cause the solder bumps to appear bright against the background of the underfill material when the semiconductor device is illuminated by selected wavelengths of light. A coating of underfill material that fills the space between the solder bumps is then applied in a manner that creates openings in the film over the solder bumps with fluxing agent. Alternatively, the underfill material may be deposited on the semiconductor device, either before or after bumping, and the fluxing composition subsequently applied over the bumps.

Referring now to FIG. 1, depicted in cross section, a bumped flip chip semiconductor device 10 contains an integrated circuit die 12 that has a plurality of contact pads or terminations 14. These pads are generally arranged in a regular array, but can be in any arrangement on the active surface 15 of the die, as is known to those of ordinary skill in the semiconductor art. Generally, a solder bump 16 is affixed to each of these pads 14, although in certain cases, depending on the design of the integrated circuit, only certain pads will be bumped while others might not contain a bump. It is not a requirement of our invention that all pads be bumped, and the number and location of the various pads that will contain a solder bump is left to the whim of the designer. A coating of underfill material 17 is disposed on the active surface 15 of the integrated circuit die 12. The use of underfill materials on flip chips is described in U.S. Pat. No. 6,194,788, and the reader is referred there for additional details on underfill methods and materials. The application of underfill can be provided in a myriad of ways that are common to the art of coatings and semiconductor processing. For example, one can dip, spray, flood coat, spin coat, or curtain coat a liquid solution of the underfill material onto the wafer, or the underfill material can be selectively applied by stenciling or printing. After applying a liquid solution of underfill, it obviously must be treated in such a way to render it at least semi-solid, for example, by heating to remove residual solvents, or if it is a high solids material, by partially curing it to convert it from a liquid to a solid. Optionally, the underfill material 17 can be applied as a solid film, laminated onto the active surface of the wafer. Some underfill materials that have been historically used include epoxies, polyimides, and silicone-polyimide copolymers. Normally, the underfill material 17 is applied such that at least a portion of the surface of the solder bumps 16 are left uncoated so that when the flip chip is ultimately assembled onto a printed circuit board, it will solder more easily. However, we also contemplate that our invention can be used in a manner where the bumps are completely covered with the underfill material and the bumps 'solder' through the underfill during the flip chip assembly step.

Figure 2:
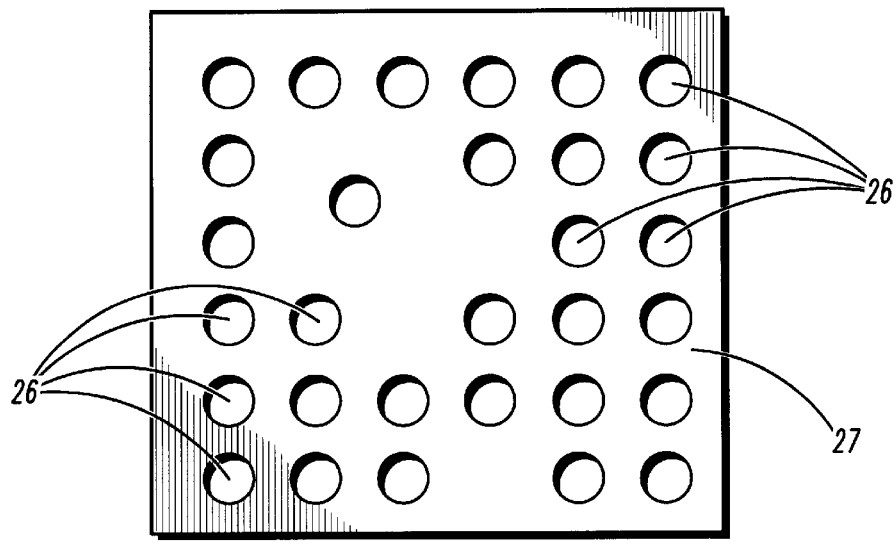
FIG. 2 is a plan view of the bottom side of FIGS. 1 and 3 in accordance with the present invention.

A fluxing agent 18 is selectively applied on top of the exposed portion of the solder bumps to aid in the soldering process during assembly to the printed circuit board and to aid in recognizing the location of the solder bumps by a machine vision system. In high-speed placement systems, machine vision is traditionally used to locate fiducials or other distinguishing features on components in order to register them prior to placement on the printed circuit board. Software programs resident in the placement machine compensate for any variances in individual components and boards, using the registration data, thus enabling the miniature parts to be placed with extreme precision and accuracy. High-speed placement systems have vision capabilities that can image, locate and determine component position from solder bumps on flip chip devices. Reflected light acquired by the CCD (charge-coupled device) camera must provide sufficient contrast in order to distinguish the primary features of interest such as solder bumps from the background. In general, because unfilled underfill materials tend to be clear, colorless or slightly amber, and solder fluxing compositions are likewise clear or amber, it is very difficult to distinguish the solder bumps from the background of the underfill, and the images produced by underfill coated die in the prior art have been poor in nature due to noise and lack of contrast. The image problem is even more pronounced in cases where the underfill material is filled, producing a white colored underfill, which has less contrast with the fluxing material deposited over the solder bumps. We have discovered that, rather than changing the camera or the lighting source, the contrast of the image can be enhanced by modifying the optical characteristics of the semiconductor device to enhance the features of interest (the solder bumps 16) while attenuating other features (the background underfill material 17). The optical performance of the part has a major impact on the performance of the machine vision system. When the fluxing agent is modified with an image enhancing agent such as a dye or pigment to make it appear red when illuminated with an appropriate light 19, and when the fluxing agent is selectively applied 18 only to the solder bumps 16, the contrast of the resulting image on the CCD camera is vastly improved. Referring now to FIG. 2, the bumps appear as bright spots 26 against the dark background 27 of the underfill material. Thus, the location of the individual solder bumps can be precisely determined by the machine vision system. For example, the majority of machine vision cameras on high-speed placement equipment use standard CCD sensor technologies that exhibit spectral sensitivities between 400 and 1000 nanometers (nm) with strong response occurring at about 660 nm, which corresponds to red light. For example, the red light emitting diode (LED) light sources commonly used in placement machine illumination sources exhibit a brightness of about 1200–1800 millicandles at peak wavelengths of approximately 621 nm–644 nm.

This discovery can be extended to other colors of flux by using matching lighting for the CCD camera. For example, blue colorants can be used with blue light (blue LEDs), green colorants with green light (green LEDs), yellow colorants with yellow light (yellow LEDs), amber, violet, and ultraviolet, etc. Clearly, the wavelength of the light used to illuminate the coated solder bumps should correspond to the color of the image enhancing agent or colorant. Some colorants that we have found useful for altering the fluxing agent to provide high contrast images include, but are not limited to, benzopyran, benzenamine, perylene, rhodamine, ardrox, diazole, fuschin, safranin O, zinc chloride, and zinc nitrate. The use of both dyes and pigments produces acceptable results, but we find that dyes are preferable to pigments as colorants. Although the term "light" is traditionally reserved for that portion of the electromagnetic spectrum capable of causing the sensation of vision, for purposes of our invention, the term "light" is defined herein as electromagnetic radiation with wavelengths ranging from infrared through visible to ultraviolet. Modem chemistry is capable of providing chemicals that reflect or fluoresce outside the traditional visible spectrum and modem electronic detectors such as CCD cameras can detect radiation in both the infrared and ultraviolet regions that are not detectable by the human eye. Fluxing agents that we have found useful include, but are not limited to, organic acids (ascorbic acid, abietic acid, adipic acid, acrylic acid, citric acid, 2-furoic acid, malic acid, polyacrylic acid, or combinations), and epoxy compounds.

In order to further enhance the image contrast, the background underfill material can also be modified to be optically different. Clear underfills cause shadow effects around the solder bumps. Black underfill produces images with lower background noise.

In an alternate embodiment of our invention, a dye that fluoresces can be substituted for the red dye in the flux and then illuminated with an ultraviolet light source, such as ultraviolet LEDs. Red fluorescing dyes or even other colors can be used if the fluorescent spectral peak of the fluorescent flux is at the same spectral frequency response peak of the machine vision camera in order to maximize the contrast. For example, the fluorescent flux is excited by a UV-B (e.g. 254 nm) or UV-A (e.g. 365 nm) ultraviolet light source that emits a fluorescent light in the orange to red region of the visible spectrum between 580 to 700 nm to accommodate the greater sensitivity of the image sensor (CCD or CMOS) in the red part of the spectrum.

When imaging the device, the CCD camera and software program can register all of the bumps in the array, or just some of the bumps. We have found that imaging only one bump on two opposing corners speeds up the process significantly, and produces registration results that are acceptable. However, depending on the software program and the individual machine, one could choose to image any number of bumps, from two to all of them. The fluxing agent containing the colorant can be applied to only the centroid portion of the bump, to the entire bump, or even overlap the bump slightly. Red flux depositions that result in images of the bump as small as two or three pixels have been shown to provide useful high resolution images.

Figure 3:
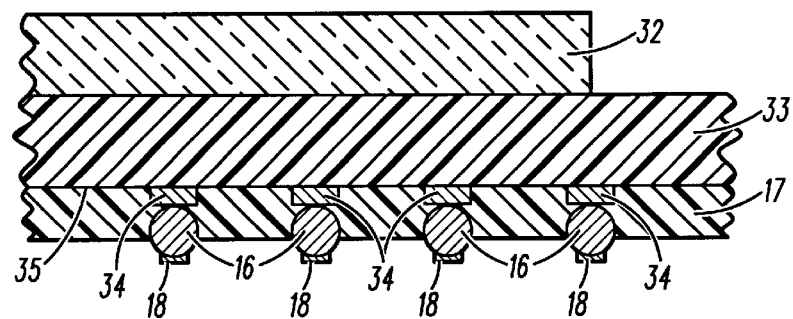
FIG. 3 is a cross-sectional view of a second embodiment of the present invention.

In still another embodiment of our invention, depicted in cross section in FIG. 3, a bumped semiconductor package 30

(such as a ball grid array (BGA) or a chip scale package (CSP)) contains an integrated circuit die 32 that is attached to a carrier substrate 33. The electrical connections between the die 32 and the carrier substrate 33 are conventionally made by wire bonds (not shown) or by flip chip mounting the die directly onto the carrier, as is well known in the art. Optionally, the bumped semiconductor package may have a cover (not shown) over the die 32 for environmental protection, as is also known in the art. The carrier substrate 33 typically has a plurality of contact pads or terminations 34 on a bottom side. These pads are generally arranged in a regular array, but can be in any arrangement, such as a perimeter array or an irregular array. Generally, a solder bump 16 is affixed to each of these pads 14, although in certain cases, depending on the design on the bumped semiconductor package, only certain pads will be bumped while others might not contain a bump. A coating of underfill material 17 is disposed on the bottom side 35 of the carrier substrate 33. Normally, the underfill material 17 is applied such that at least a portion of the surface of the solder bumps 16 are left uncoated so that when the bumped semiconductor package is ultimately assembled onto a printed circuit board, it will solder more easily. However, we also contemplate that our invention can be used in a manner where the bumps are completely covered with the underfill material and the bumps 'solder' through the underfill during the flip chip assembly step. A fluxing agent 18 is selectively applied on top of the exposed portion of the solder bumps to aid in the soldering process during assembly to the printed circuit board and to aid in recognizing the location of the solder bumps by a machine vision system. When the fluxing agent is modified with an image enhancing agent such as a dye or pigment to make it appear red when illuminated with an appropriate light, and when the fluxing agent is selectively applied 18 only to the solder bumps 16, the contrast of the resulting image on the CCD camera is vastly improved. Referring now to FIG. 2, the bumps appear as bright spots 26 against the dark background 27 of the underfill material. Thus, the location of the individual solder bumps can be precisely determined by the machine vision system.

In summary, we have discovered a way to create a semiconductor device (flip chip, BGA, or CSP) that exhibits enhanced pattern recognition when illuminated in a machine vision system. Contrast enhancement is achieved by addition of red or other color dyes or pigments to the flux to modify the part's optical characteristics without changing existing standard CCD camera and lighting configurations. Vastly improved image contrast is obtained while maintaining the necessary thick underfill coating. The bump image size is now more dependent on red flux deposition and depends less on the actual bump exposed area. The machine vision camera can even see an underfill covered bump as long as there is red flux on top of the underfill. Conventional high speed placement assembly equipment can repeatably recognize and accurately place the coated parts with high yields. In the illustrations above, we have described the use of red dye added to the fluxing agent that is selectively placed on the solder bumps. However, this should not be limiting since other colors and materials can be used. Other variations will occur to those skilled in the art upon consideration of the teachings herein. Such alternative devices should be considered equivalents, and the invention should not be so limited.

While the invention has been described in conjunction with specific embodiments, it is evident that many alternatives, modifications, permutations and variations will become apparent to those of ordinary skill in the art in light of the foregoing description. Accordingly, it is intended that the present invention embrace all such alternatives, modifications and variations as fall within the scope of the appended claims.

What is claimed is:

1. A bumped semiconductor chip exhibiting enhanced pattern recognition when illuminated in a machine vision system, comprising:

a flip chip integrated circuit die having a plurality of solder bumps on an active face thereof;

a coating of an underfill material on the active face;

a fluxing composition containing an image enhancing agent, selectively deposited over at least two of the plurality of solder bumps to modify the optical characteristics of the solder bumps; and wherein the deposited image enhancing agent causes the solder bumps to appear bright against the underfill material when the active face is illuminated by selected wavelengths of light.

2. The bumped semiconductor chip as described in claim 1, wherein the image enhancing agent is a colorant.

3. The bumped semiconductor chip as described in claim 2, wherein the colorant is a dye or a pigment.

4. The bumped semiconductor chip as described in claim 2, wherein the colorant is selected from the group consisting of red, amber, yellow, green, blue, violet, or a material that fluoresces in ultraviolet light.

5. The bumped semiconductor chip as described in claim 1, wherein the selected wavelengths of light are that portion of the electromagnetic spectrum that corresponds to the color of the image enhancing agent.

6. The bumped semiconductor chip as described in claim 2, wherein the colorant is one or more materials selected from the group consisting of benzopyran, benzenamine, perylene, rhodamine, ardrox, diazole, fuschin, safranin O, zinc chloride, and zinc nitrate.

7. The bumped semiconductor chip as described in claim 1, wherein the image enhancing agent is a fluorescing compound.

8. The bumped semiconductor chip as described in claim 7, wherein the image enhancing agent is a red fluorescing compound.

9. The bumped semiconductor chip as described in claim 7, wherein the selected wavelengths of light are in the ultraviolet portion of the spectrum.

10. The bumped semiconductor chip as described in claim 1, wherein the fluxing composition is deposited only over the solder bumps and not on any other portions of the underfill material.

11. A bumped semiconductor chip exhibiting enhanced pattern recognition when illuminated in a machine vision system, comprising:

a flip chip integrated circuit having a plurality of solder bumps on an active face thereof;

an underfill material coated on the active face; and a flux containing a colorant, deposited only on each of the solder bumps to modify the optical characteristics of the solder bumps when illuminated by a light source in the machine vision system.

12. The bumped semiconductor chip as described in claim 10, wherein at least a portion of each of the solder bumps is not coated with underfill material.

13. The bumped semiconductor chip as described in claim 11, wherein the underfill at least partially covers the solder balls, and the flux is deposited directly on the underfill.

14. The bumped semiconductor chip as described in claim 11, wherein the flux is deposited only over the solder bumps and not on any other portions of the underfill material.

15. The bumped semiconductor chip as described in claim 11, wherein the colorant is a dye.

16. The bumped semiconductor chip as described in claim 11, wherein the colorant is a pigment.

17. The bumped semiconductor chip as described in claim 11, wherein the colorant is selected from the group consisting of red, amber, yellow, green, blue, violet, or a material that fluoresces in ultraviolet light.

18. The bumped semiconductor chip as described in claim 11, wherein the colorant is one or more materials selected from the group consisting of benzopyran, benzenamine, perylene, rhodamine, ardrox, diazole, fuschin, safranin O, zinc chloride, and zinc nitrate.

19. The bumped semiconductor chip as described in claim 11, wherein the light source is selected from the group consisting of red, amber, yellow, green, blue, violet, or ultraviolet light.

20. The bumped semiconductor chip as described in claim 11, wherein the light source is of a color that corresponds to the color of the colorant.

21. The bumped semiconductor chip as described in claim 11, wherein the flux containing a colorant is deposited on at least two of the plurality of solder bumps.

22. In the automatic high speed assembly of bumped semiconductor chips to printed circuit boards, a bumped semiconductor chip exhibiting enhanced pattern recognition when illuminated in a machine vision system, comprising:

a flip chip integrated circuit having a plurality of solder bumps on an active face thereof;

an underfill material coated on the active face such that at least a portion of each of the solder bumps remains uncoated; and a flux containing a red dye, deposited only on each of the solder bumps, to modify the optical characteristics of the solder bumps when illuminated by a red light source in the machine vision system.

23. A bumped semiconductor package exhibiting enhanced pattern recognition when illuminated in a machine vision system, comprising:

a circuit carrying substrate having first and second sides;

a semiconductor device electrically and mechanically mounted on the first side of the circuit carrying substrate;

the circuit carrying substrate second side having a substantially coplanar array of solder bumps;

a coating of an underfill material on the circuit carrying substrate second side;

a fluxing composition containing an image enhancing agent, selectively deposited over at least two of the solder bumps in the array to modify the optical characteristics of the solder bumps; and wherein the deposited image enhancing agent causes the solder bumps to appear bright against the underfill material when the circuit carrying substrate second side is illuminated by selected wavelengths of light.

* * * * *